United States Patent
Mehrotra et al.

(10) Patent No.: US 6,601,222 B1
(45) Date of Patent: Jul. 29, 2003

(54) COUPLED NOISE ESTIMATION AND AVOIDANCE OF NOISE-FAILURE USING GLOBAL ROUTING INFORMATION

(75) Inventors: Sharad Mehrotra, Austin, TX (US); Parsotam Trikam Patel, Austin, TX (US); David J. Widiger, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 09/687,132

(22) Filed: Oct. 13, 2000

(51) Int. Cl.[7] .................. G06F 17/50; G01R 31/00; G01R 19/00
(52) U.S. Cl. ................ 716/5; 716/4; 716/5; 716/6; 716/8; 716/12; 716/13; 716/19; 702/58; 702/64
(58) Field of Search .................. 716/1–21, 5

(56) References Cited

U.S. PATENT DOCUMENTS

| | | | | | |
|---|---|---|---|---|---|
| 4,615,011 A | * | 9/1986 | Linsker | ................ | 716/13 |
| 5,471,397 A | * | 11/1995 | Hsieh et al. | ................ | 716/5 |
| 5,535,133 A | * | 7/1996 | Petschauer et al. | ........... | 716/19 |
| 5,856,927 A | * | 1/1999 | Greidinger et al. | ........... | 716/12 |
| 6,029,117 A | * | 2/2000 | Devgan | ................ | 702/58 |
| 6,117,182 A | * | 9/2000 | Alpert et al. | ................ | 716/8 |
| 6,253,359 B1 | * | 6/2001 | Cano et al. | ................ | 716/6 |
| 6,305,004 B1 | * | 10/2001 | Tellez et al. | ................ | 716/12 |
| 6,327,542 B1 | * | 12/2001 | McBride | ................ | 702/64 |
| 6,378,109 B1 | * | 4/2002 | Young et al. | ................ | 716/4 |
| 6,389,581 B1 | * | 5/2002 | Muddu et al. | ................ | 716/6 |
| 6,405,348 B1 | * | 6/2002 | Fallah-Tehrani et al. | ....... | 716/4 |
| 2001/0047507 A1 | * | 11/2001 | Pileggi et al. | ................ | 716/8 |
| 2002/0010901 A1 | * | 1/2002 | Otaguro | ................ | 716/12 |

* cited by examiner

*Primary Examiner*—Vuthe Siek
*Assistant Examiner*—Andrea Liu
(74) *Attorney, Agent, or Firm*—Robert M. Carwell; Bracewell & Patterson, L.L.P.

(57) ABSTRACT

Disclosed is a method for pre-design estimation of coupling noise and avoidance of coupling noise failures in interconnects. An initial routing of a plurality of nets is estimated utilizing global paths. Then, the worst-case and average-case models for various parameters of each net are evaluated. With these models, a noise analysis is completed by which a determination is made whether coupling noise of any one of the nets is above a threshold level for noise-induced failure (i.e., a noise-failure threshold). When it is determined that the estimated coupling noise of a net falls below the noise-failure threshold, a response mechanism is triggered for later implementation during detailed routing of the nets to prevent the coupling noise from reaching the noise-failure threshold.

24 Claims, 6 Drawing Sheets

COUPLED NOISE ESTIMATION AND AVOIDANCE OF NOISE-FAILURE USING GLOBAL ROUTING INFORMATION

BACKGROUND OF THE INVENTION

1. Technical Field

The present invention relates in general to circuit interconnects (nets) and in particular to a method for efficient routing of nets of a circuit. Still more particularly, the present invention relates to a method and program product for estimating and subsequently reducing coupled noise in nets during preliminary design (i.e., global routing) of a circuit.

2. Description of the Related Art

One cause of propagation delays or faults in interconnects (or nets) of Very Large-Scale Integration (VLSI) circuits is noise induced by capacitive coupling of neighboring nets. Because of the lack of a dedicated ground plane and poor shielding, VLSI interconnects can have severe coupling problems, which ultimately reduces the efficiency of signal propagation in the circuit and in extreme cases causes operation of the circuit to fail. Presently, most of the problems caused by coupling are avoided by conservative design practices such as buffering long interconnect lines and utilizing restoring logic circuits, etc.

Ideally, the capacitive-coupling problem can be eliminated with a more accurate pre-layout noise analysis. However, there is generally a lack of information about wire couplings, and most coupling problems can only be identified after the circuit design is fully constructed, i.e., after routing of the interconnects. The process of actually routing the interconnects is referred to as detailed routing. Following detailed routing, both a detailed interconnect extraction of the signal couplings and a circuit simulation are required to identify coupling problems and assess the severity of the problems.

Typically, after detailed routing, a resistive-capacitive (RC) representation for each net is extracted from the layout, including coupling capacitances. Then, the coupling capacitances are examined to determine neighboring nets that can couple noise to the net under consideration. The net under consideration is called a "victim" net, and the neighboring nets are called "aggressor" nets. Each aggressor net's coupling is then simulated. Typically, the process requires knowledge of the transition time of the aggressor net. In most cases, only the largest aggressor capacitive couplings are examined. The noise contributed by each of these aggressor nets is then aggregated using information about the time (or time window) when signals propagating on the aggressor nets switch. The resulting total noise is compared to the noise immunity of each receiver of the victim net, and if the total noise exceeds the noise immunity, the net is deemed to have a noise failure.

Thus, in order to conduct such a noise analysis, the number of aggressors, the strength of the couplings, and the switching characteristics of the aggressors must all be known.

Fixing the coupling problems after the detailed routing requires at least a new routing and another extraction and noise verification. Since the noise-analysis and subsequent adjustments occur late in the design cycle, the noise analysis and correction has a severe impact on the product release schedule.

Thus, methods are required to assess potential coupling noise problems early in the design cycle. The task is very difficult since the data needed for noise analysis is only available very late in the design cycle. Hence, most designers resort to a worst case analysis. Under the worst case analysis, each wire (net) is assumed to be coupled to wires on either side at the minimum permissible spacing. Accordingly, the wire length is constrained such that it does not exceed a threshold length where the worst-case coupling may disturb any of the receivers connected to the net. Under the analysis, the maximum wire length is usually very pessimistic for of most nets because of the conservative coupling assumption. Also, to keep wire length below the maximum wire length, buffers are inserted periodically in the net, and the driver size may be increased (a larger driver will have a longer wire threshold length). Both of the above actions result in higher power consumption and may also have an adverse effect on chip timing.

Traditionally, the worst-case model is utilized to make all decisions (spacing, shielding, buffering) and leads to quite a few post-design fails. Use of the worst-case model leads to significant over-design, because a lot of nets which would not have noise problems after layout are constrained through buffering or shielding.

The present invention recognizes that it would be desirable to have a method and system for efficiently evaluating coupling noise for interconnects during the global routing stage of circuit design. The invention further recognizes that a method and system by which and major noise-induced failures are avoided early in the circuit design (i.e., prior to detailed routing) would be a significant improvement. These and other benefits are provided by the invention described herein.

SUMMARY OF THE INVENTION

Disclosed is a method for pre-design estimation of coupling noise and avoidance of coupling noise failures in interconnects. An initial routing of a plurality of nets is estimated utilizing global paths. Then, the worst-case and average-case models for various parameters of each net are evaluated. With these models, a noise analysis is completed by which a determination is made whether coupling noise of any one of the nets is above a threshold level for noise-induced failure (i.e., a noise-failure threshold). When it is determined that the estimated coupling noise of a net falls below the noise-failure threshold, a response mechanism is triggered for later implementation during detailed routing of the nets to prevent the coupling noise from reaching the noise-failure threshold.

In the preferred embodiment, the nets' parameters utilized in the noise analysis include aggressor capacitance, drive strength of aggressor, transmission times, and switching windows. Responses to the evaluation includes increased spacing between nets and utilization of wires adjacent to non-switching lines, such as power lines, for routing the nets.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

The present invention provides a method for estimating coupling noise on nets (i.e., identifying nets which could potentially have a problem due to coupling noise) before a detailed routing and extraction can be performed on a circuit design. The method further modifies the routing layout based on the estimation to avoid noise-failures after detailed routing.

The estimation (i.e., analysis) uniquely takes advantage of the "global routing" performed prior to detailed routing. Several response mechanisms are provided by which the identified nets with potential noise-induced failures may be fixed. The results of the estimation and subsequent "fix" are easily performed and may be incorporated in a subsequent global routing run. Thus, in one embodiment, the estimation process is repeated several times to ensure a design that is free from significant coupling noise problems, and which provides good timing and efficient routability. Once the estimation and subsequent fix are completed, the final design may then be completely wired by a detailed router. The invention ensures a high degree of success in the subsequent extraction and analysis of the final design.

Figure 1:
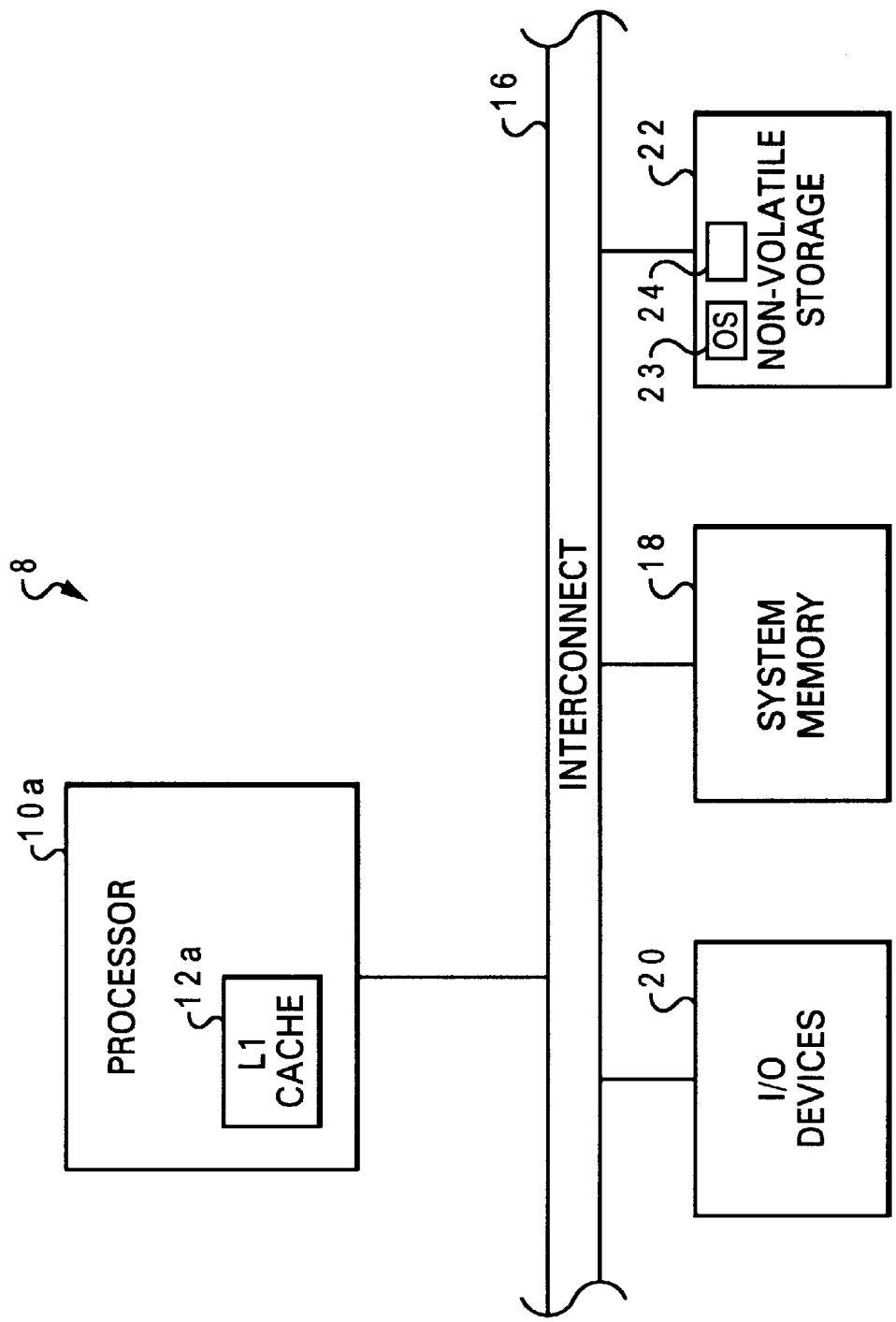
FIG. 1 is a block diagram of a data processing system utilized in one embodiment of the present invention.

With reference now to the figures and in particular with reference to FIG. 1, there is illustrated a block diagram of the basic structure of a data processing system 8 utilized in the implementation of one embodiment of the invention. Data processing system 8 has at least one processor 10 which is connected to several peripheral devices via interconnect 16. The peripheral devices include input/output devices 20 (such as a display monitor, keyboard, and graphical pointing device) for user interface, a permanent memory device (i.e., non-volatile storage) 22 for storing the data processing system's operating system 23 and program applications, and a temporary memory device (system memory) 18 that is utilized by processor 10 during execution of current program instructions.

In the preferred embodiment, the application programs of data processing system 8 includes global routing tool 24, which carries out the various processes of the invention as described below. As shown, global routing tool 24 may be stored on a computer readable medium such as non-volatile storage 22. Program code of global routing tool 24 includes the functional features of noise estimation and avoidance as provided by the present invention.

Those skilled in the art will further appreciate that there are other components that might be utilized in conjunction with those shown in the block diagram of FIG. 1. Also, other types of processor devices may be advantageously utilized to complete the processes of the invention. For example, a specific-purpose processor device designed for global routing and/or detailed routing of chips may be utilized in place of general-purpose data processing system 8.

A detailed routing tool may also be included among the program applications of data processing system 8 and receive as its input the results of global routing and subsequent noise analysis and suggested noise-failure avoidance measures as will become clear later. Global routing is completed as the first step of a detailed routing of a chip and entails dividing the chip layout area into rectangular "tiles."

Figure 2:
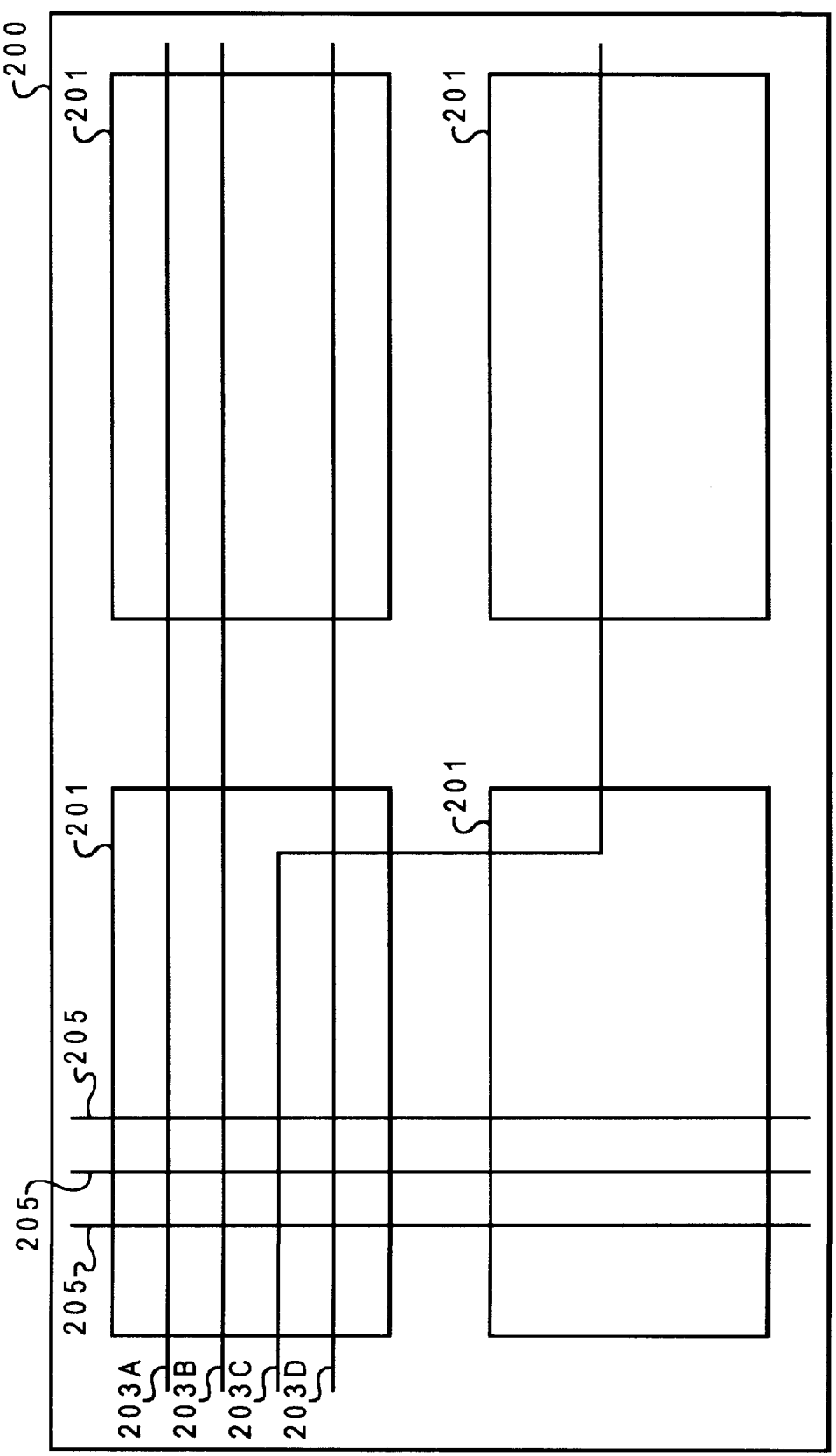
FIG. 2 is a block diagram of a circuit illustrating victim nets and aggressor nets in accordance with the present invention.

FIG. 2 illustrates a circuit layout of an integrated circuit (IC) chip 200 including a number of tiles 201. The pin connections (not shown) of the chip wiring are mapped onto these tiles 201 and parallel (or adjacent) nets 203A–203C on a first wiring level. Chip 200 also includes other nets 205 running orthogonally to parallel nets 203A–203C on a second wiring level. Several additional layers of wiring are possible in the chip layout. All pin connections that map to a tile 201 are located near the center of that tile 201. FIG. 2 provides a magnified view of the tiles on the IC chip. Those skilled in the art understand that tiles 201 are typically adjacent to each other and are illustrated with separating spaces merely for illustrative purposed.

During global routing, each tile 201 is evaluated for available wire density by counting the total number of wiring tracks available on all the wiring layers in the tile area. Typically, wiring is routed in two orthogonal directions, and each wiring layer has a preferred direction. Hence, the available wiring tracks on which parallel nets 203A–203D and other nets 205 are located are divided between the two orthogonal directions. Following the evaluation of available wiring density, global routing tool 24 subtracts from the total wiring availability all blockages due to circuit wiring, clocks, power and ground, pre-routed nets, and nets that have all their connections on a single tile. The remaining tracks are the tracks available for the global wiring of the chip 200 (i.e., placement/routing of nets).

Global routing tool 24 then undertakes the task of connecting all the chip wires over the global tile map, such that the number of wires crossing a tile in a given direction are fewer than the number of available tracks in the tile in that direction. No attempt is made to resolve the actual track that any given wire is going to occupy. The resolution of the actual tracks is completed later during detailed routing. The primary task of global routing tool 24 is to determine the global paths that will permit all the nets in the chip to be connected without any overflows when resolved by detailed routing.

In addition to allocating global paths for each net, the present invention provides enhanced features to the global routing tool by which the results of a noise analysis typically available after detailed routing are made available before actually completing a detailed routing. By utilizing global routing, which can typically be completed in a fraction of time of the detailed routing and requires much less design preparation, the invention provides an efficient method for analyzing circuit behavior, particularly, coupling noise behavior.

Utilizing the functionality of the invention, global routing tool 24 determines which tiles are congested (i.e., the number of wires are almost equal to, or greater than, the number of available tracks). Global routing tool 24 also determines if some nets of the circuit must be routed with a significant wire-length penalty. Global routing tool 24 further determines when to assign some nets to specific wiring layers and determines the impact of using a different wire-type (different wire-width or spacing) for a given net.

The invention allows global routing tool 24 to find a global wiring solution, which has a very high likelihood of not having coupling noise problems (or easily fixed noise problems), when detailed routing is later performed. During global routing, the aggressor nets are not known and a detailed analysis may not be completed. Thus, the invention utilizes a series of simplifying assumptions and calculations to enable completion of a sufficiently reliable noise analysis from global routing.

As utilized herein detail routing is defined to mean the process of actually connecting nets of a IC chip (or other circuit) to logic components of the circuit. Detail routing is understood to also refer to the analysis of the routing paths after the connections have been made. In the preferred embodiment, the invention utilizes the interconnect capacitance estimation technique described in *Method And System For Performing Capacitance Estimations On An Integrated Circuit Design Routed By A Global Routing Tool*, U.S. application Ser. No. 09/397,762 (IBM Docket No. AT9-99-267) filed on Sep. 17, 1999, the entire content of which is hereby incorporated by reference. The above application is referred to hereinafter as *Performing Capacitive Estimations*.

Figure 3A:
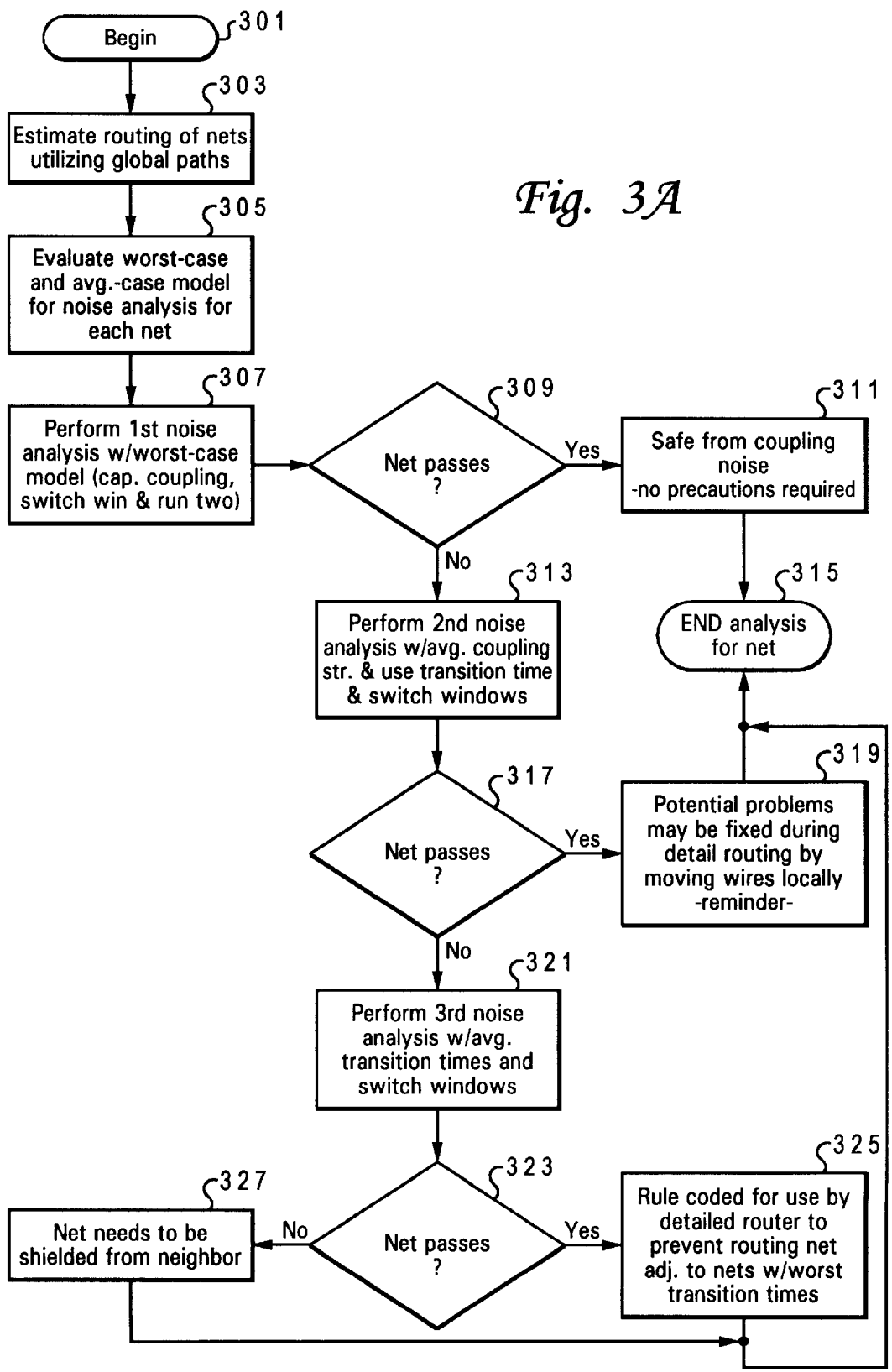
FIGS. 3A and 3B are flow charts of the process of performing coupling noise analysis on nets during global routing in accordance with a preferred implementation of the present invention.

FIG. 3A illustrates the steps of the process of completing an estimated noise analysis in accordance with one embodiment of the invention. The process begins at block 300, and then at block 303, an estimate of the routing of the nets is completed utilizing global paths according to *Performing Capacitance Estimations*. Following, both the worst case and the average case models of parameters required for noise analysis of each net are determined at block 305. Several different parameters are utilized in the noise analysis.

Figure 3B:
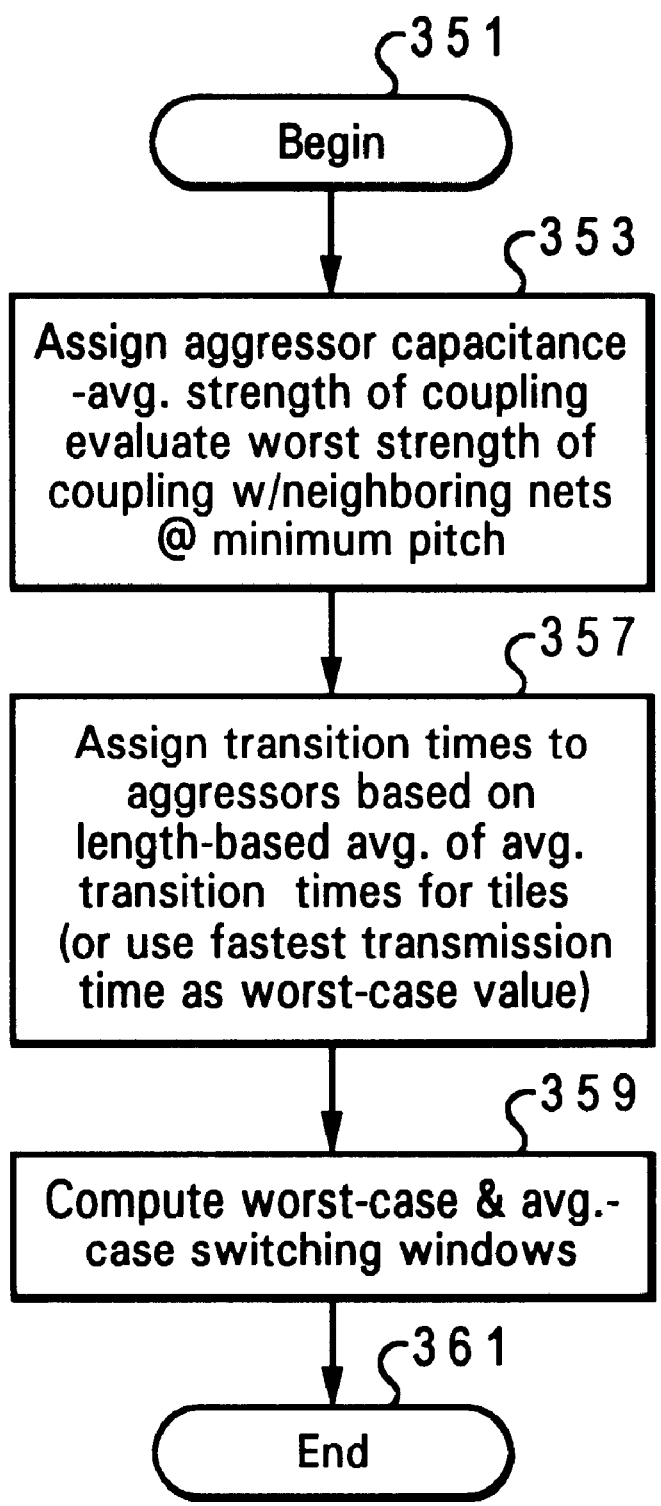

FIG. 3B illustrates the process of evaluating worse case and average case models for each parameter utilized in the noise analysis. The entire process is completed by software executing on data processing system 8. The process begins at block 351, and the aggressor capacitance (i.e., the capacitance of each aggressor net) for each net is assigned at block 353. The assignment of aggressor capacitance entails computing the average coupling strength and the worst case coupling strength of adjacent (parallel) nets. Each wire segment has two adjacent aggressors, one on either side. The average strength of the coupling is evaluated probabilistically, as provided in *Performing Capacitance Estimations*. The worst case strength of the coupling is evaluated assuming that neighboring wires are located at a minimum pitch on either side.

Global routing tool 24 takes into consideration that each net is composed of a number of wire segments and that each segment runs on a given wiring level. Also, in most modern VLSI designs, each wiring layer has wires running essentially in one direction, and the wiring direction alternates between two orthogonal directions from one layer to the next. Thus, the dominant couplings of a wire segment are due to other wires on the same layer running adjacent to the wire on either side. A further consideration used to assign aggressor capacitance is that whenever a net changes wiring levels, the adjacent wires typically change.

Following the computation of aggressor capacitance, all the nets crossing a tile are examined to determine the fastest transition time, and the average transition time at that tile at block 357. The calculation of the transition time entails first determining the worst-case and average value of drive strength for each aggressor. All nets routed across each tile are examined for fastest transition times and average transition time. Then, the drive strength of the aggressor may be assigned a worst-case value or an average-case value. For all the tiles traversed by a segment of a net, the aggressors for that segment are assigned the length-based average of the average transition times for the nets at the corresponding tile as the average value of the aggressor transition time. Otherwise, the fastest transition time for the net over all the tiles traversed is chosen as the worst-case value.

A similar analysis is completed for signal switching windows at block 359. The worst-case switching windows are computed by taking the earliest of the early signal arrival times and the latest of the late signal arrival times. The average-case windows are computed utilizing the average early and average late signal arrival times. Utilizing the assigned values for aggressor capacitance, transition times, and switching windows, worst-case and an average-case models for noise analysis are derived for each net.

Returning now to FIG. 3A, a first noise analysis is performed utilizing the worst-case model (i.e., the worst-case capacitive coupling with worst-case switching windows and transition time) at block 307. A determination whether the net passes the noise analysis (i.e., wether the coupling noise utilizing the worst-case model parameters falls below a pre-selected noise-failure threshold) is completed at block 309. The noise failure threshold is a parameter entered by the circuit designer. If the net passes the worst-case model, then the net is considered safe from coupling noise for the detailed layout at block 311 and no special precautions need to be taken. The noise analysis for each net that passes the first noise analysis ends at block 315.

If, however, a net fails the first noise analysis, then a second noise analysis is performed at block 313 utilizing the average coupling strength, along with the worst transition times and switching windows. A determination whether the net passes the second noise analysis is made at block 317. If the net passes the second noise analysis, no global routing fixes are required for the net because, on average, the net will pass a later analysis performed during the detailed routing and potential problems can be fixed during detailed routing. When the net suffers due to worse than average coupling, the detailed routing tool is provided a routing code (or tag, rule, or signal) regarding the net at block 319. The routing code is utilized during detailed routing to fix the problem by moving wires locally to create extra space for the net to conform to the average loading.

If the net fails the second noise analysis, a third noise analysis is performed at block 321 using the average transition times and average switching windows. A determination is made at block 323 whether the net passes the third noise analysis. In the preferred embodiment, if the net passes the third noise analysis, a routing code is provided at block 325 for the detailed router to prevent the net from being routed adjacent to nets with the worst transition times.

If, however, the net fails the third noise analysis, an assumption is made and a routing code recorded that the net needs to be shielded from the neighboring nets at block 327. In one embodiment, the routing codes are provided to the detailed routing tool. In another embodiment, the routing code is outputted to a designer, who may then adjust the input parameters to the detailed router for a particular net. The noise analysis then ends at block 315.

The preferred embodiment utilizes two mechanisms for shielding. These mechanisms are (1) increasing spacing between the net and the neighboring nets and (2) placing the net next to a non-switching line, e.g., a power supply wire. In modern complementary metal-oxide semiconductor (CMOS) VLSI chips, the power supply wire is usually coplanar with the signals. The current travels in the power supply wire at a fixed frequency. Hence, there are a fixed number of tracks (i.e., two tracks for each power supply wire traversing a tile) that run adjacent to the power supply, which can be used for wiring noise sensitive nets or problem nets (i.e., nets that fail the noise analysis). During execution of the preferred embodiment of invention, global router tool 24 implements the second shielding mechanism (i.e., routing the problem nets adjacent to power supply wires) first before allocating additional wiring space.

Figure 4:
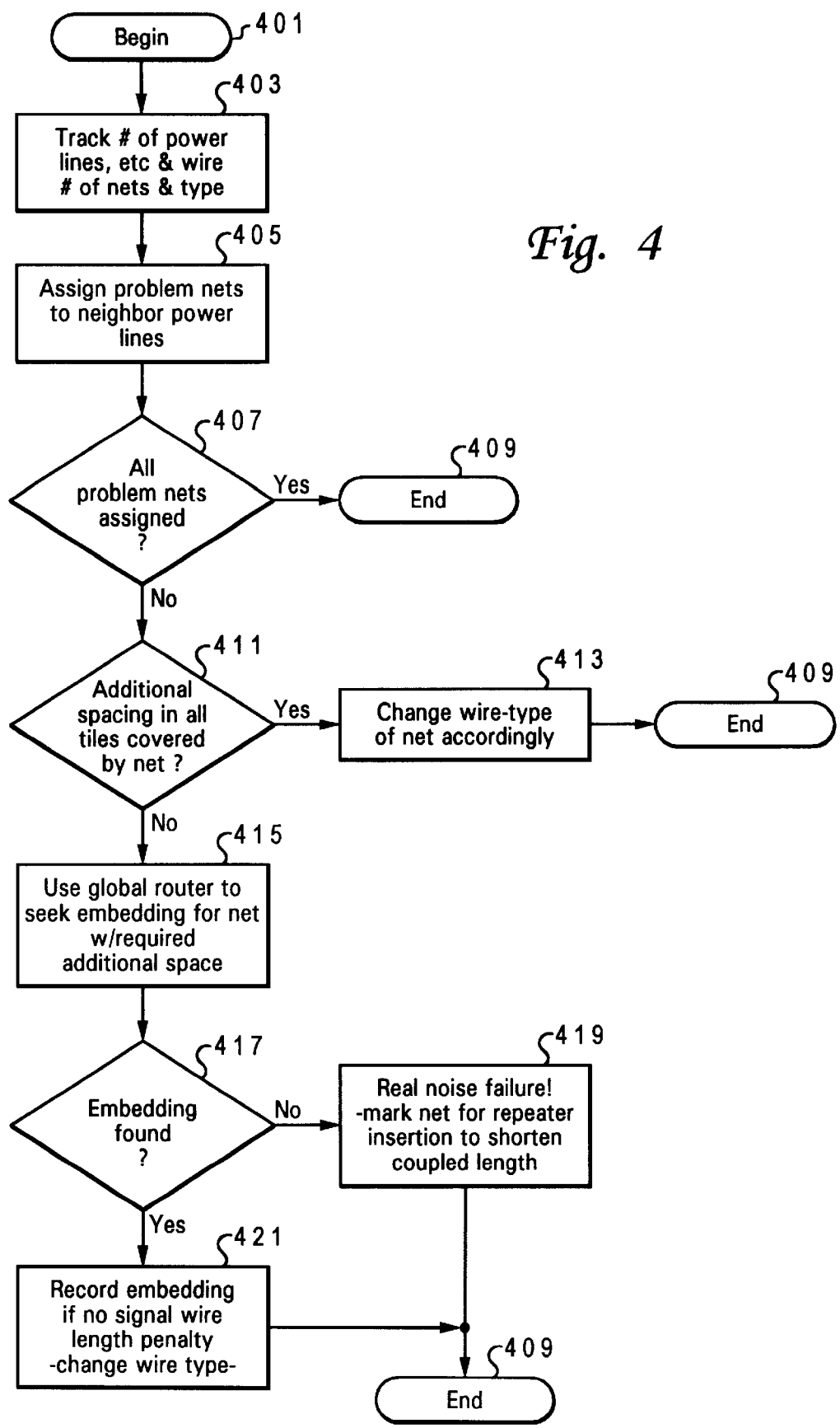
FIG. 4 is flow chart of noise-failure avoidance steps in accordance with a preferred embodiment of the invention.
Figure 5A:
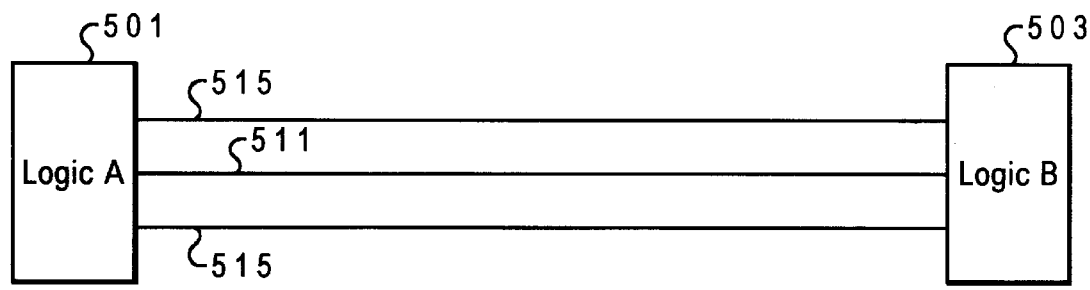
FIGS. 5A–5D illustrate placement of a victim net and aggressor nets according to the noise-failure avoidance steps implemented in accordance with a preferred embodiment of the invention.

FIG. 4 illustrates the process steps of routing problem nets. The process begins at block 401, and the number of problem nets is determined (utilizing the processes of FIGS. 3A and 3B) for each tile 21 at block 403. As many of the problem nets as can be routed on a wiring track adjacent to a power supply wire are assigned these wiring tracks at block 405. FIG. 5C illustrates the routing of a problem net 511 that couples logic A 501 to logic B 503 adjacent to power supply wire 513 to reduce coupling noise effects. Returning to FIG. 4, a determination is made at block 407 whether all the problem nets have been assigned. If all the problem nets have been assigned, the process ends at block 409. If not all the problem nets have been assigned (i.e., the number of problem nets exceeds the number of wiring tracks adjacent to power supply wires crossing the tile), no further problem nets that cross the tile may utilize a "power shield", and the utilization of additional spacing is then initiated.

Figure 5B:
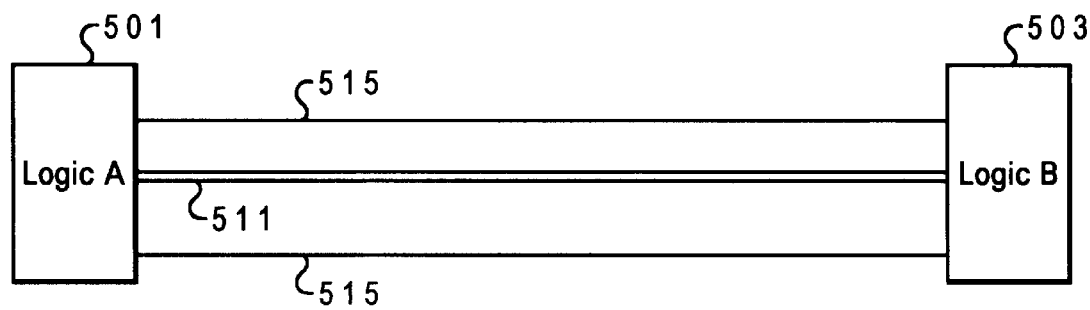
Figure 5C:
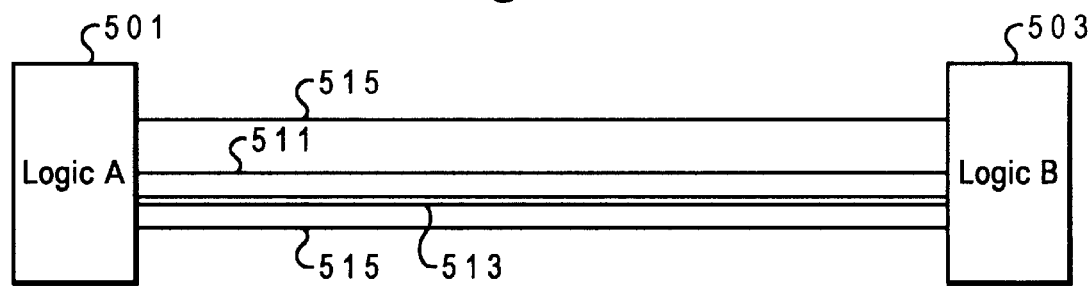

FIG. 5B illustrates the use of additional spacing. Average or minimum spacing of net 511 to neighbor nets 515 is illustrated in FIG. 5A. As shown in FIG. 5B extra spacing is utilized between problem net 511 and neighboring or aggressor net 515 to reduce coupling noise effects. The extra spacing also allows utilization of a wider wire for problem net 511.

Returning to FIG. 4, a determination is made at block 411 of whether additional spacing exists in all the tiles 21 including the problem net. If additional spacing is available in all tiles the problem net traverses, then the wire type of the net is changed to reflect the additional spacing requirement at block 413, and the process ends at block 409. If, however, additional spacing is not available in all tiles 21 that the problem net traverses, global routing tool 24 is invoked again at block 415 to find a next embedding for the problem net with the additional spacing requirement. A determination whether a next embedding is available is made at block 417. If a next embedding is found with no significant wire length penalty, the next embedding is assigned to the problem net and the wire type is changed at block 421. If, however, a next embedding is not found, the problem net is considered to have a real noise failure and is tagged as a candidate for repeater insertion to shorten the coupled length at block 419. Then the process ends at block 409.

At the end of the above steps, all the nets in the circuit design have been examined, and wire type changes, routing changes or shielding decisions have been made to ensure high likelihood of the circuit design passing the detailed noise analysis after detailed routing. Thus, the invention substantially reduces or removes congestion or routability problems prior to the detailed routing. Problem nets with un-corrected noise problems are tagged for repeater insertion. The entire process is very fast, and an entire integrated chip (IC) circuit can be evaluated in a few hours instead of the several days required for detailed routing, extraction, and analysis. The process is preferably repeated several times to obtain a high level of confidence that the detailed routing design passes the initial noise analysis.

Other optimization techniques may be applied during global routing to improve noise immunity. The ability to analyze the average (or expected) behavior allows these other optimization, which includes (1) utilization of less only a pre-selected percentage of available tracks, and (2) reducing dominant couplings of each net.

Instead of allowing global routing tool 24 to use all available tracks, global routing tool 24 is programmed to use only a given fraction (e.g., 8/10) of available tracks in each tile. If global routing tool 24 can route all wires with the smaller number of available tracks without adversely affecting the chip timing due to extra wire length, then a better design is provided from a noise immunity standpoint since there is extra space in each tile for shielding, if required. The impact on chip timing is assessed by using the global routing based net estimation and average capacitance modeling.

Figure 5D:
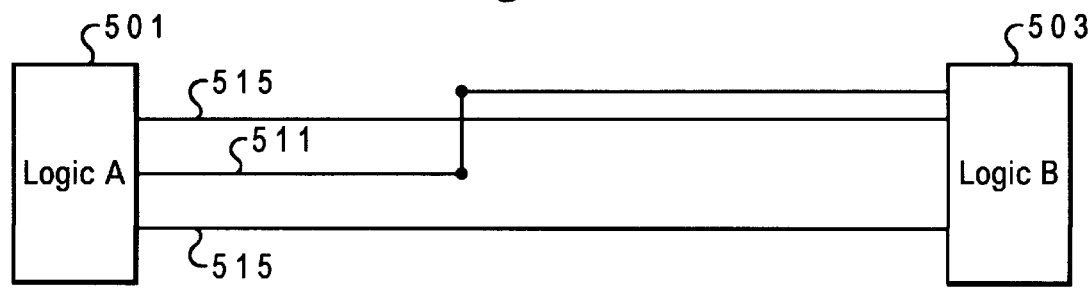

The main source of noise failure is the dominant couplings of a net. Several smaller couplings are unlikely to cause a noise-failure since they are coupled for only short distances. Hence, a net has better noise immunity if the length of dominant couplings are smaller. The more minor segments there are in a net, the more couplings the net has, and consequently, the number and length of dominant couplings are smaller. As shown in FIG. 5D, one way of effecting the smaller couplings is to introduce bends 517 or "jogs" in the net. For L-shaped nets, several bends 517 can be introduced without increasing the length of the net.

Bends are introduced in a controlled manner in global routing by introducing "Steiner Points" for a net. Steiner points essentially are tile locations that the net must traverse, even though the net does not have pins in those tiles. For example, with a net that connects two pins, one in tile (x1, y1) and the other in tile (x2, y2), where x2-x1>1 and y2-y1>1, global routing tool 24 introduces extra jogs in the wire by picking values x3 and y3 (x1<x3<x2 and y1<y3<y2) and creating a Steiner point (x3, y3) for the net. Depending on the path chosen by global routing tool 24, one or two extra jogs are created in the wire. If there is a large number of wires that connect between (x1,y1) and (x2,y2), introducing a Steiner point (under the above restrictions) randomly for each wire will force the nets to take significantly different routes, thereby significantly reducing the likelihood of large couplings between the nets.

As a final matter, it is important that while an illustrative embodiment of the present invention has been, and will continue to be, described in the context of a fully functional data processing system, those skilled in the art will appreciate that the software aspects of an illustrative embodiment of the present invention are capable of being distributed as a program product in a variety of forms, and that an illustrative embodiment of the present invention applies equally regardless of the particular type of signal bearing media used to actually carry out the distribution. Examples of signal bearing media include recordable type media such as floppy disks, hard disk drives, CD ROMs, and transmission type media such as digital and analogue communication links.

While the invention has been particularly shown and described with reference to a preferred embodiment, it will be understood by those skilled in the art that various changes in form and detail may be made therein without departing from the spirit and scope of the invention.

What is claimed is:

1. A method for early estimation of coupling noise in nets of a circuit, said method comprising the steps of:
   designing a global routing of a plurality of nets utilizing global paths;
   estimating worst-case and average-case models for said at least one net parameter;
   determining whether coupling noise of any one of said plurality of nets is above a noise-failure threshold; and
   in response to determining that coupling noise of at least one of said nets is above said noise-failure threshold, selecting a specific design response that reduces said coupling noise to below said noise-failure threshold.

2. The method of claim 1, wherein:
   said determining step includes the step of performing a noise analysis for each of said plurality of nets utilizing a combination of models from among said worst-case and said average case models.

3. The method of claim 2, wherein said at least one net parameter is selected from among switching windows, capacitive coupling, and signal transition times.

4. The method of claim 1, wherein said selecting step includes transmitting a result of said noise-analysis to an output device.

5. The method of claim 1, wherein said selecting step further includes encoding a routing design rule for routing said net during a detailed routing.

6. The method of claim 1, wherein said selecting a specific design response includes selecting one or more responses from among: changing physical attributes of the at least one net; re-routing at least one net; changing power level across at least one net; and amplifying a signal across at least one net.

7. The method of claim 1, further comprising reducing coupling noise of the at least one net below the noise failure threshold by implementing the specific design response during subsequent detailed routing, wherein each net in the detailed routing has coupling noise below the noise-failure threshold.

8. A method comprising the steps of:
   designing a global routing of a plurality of nets of an integrated circuit utilizing global paths;
   estimating worst-case and average-case models for said at least one net parameter;
   determining whether coupling noise of any one of said plurality of nets is above a noise-failure threshold; and
   in response to determining that coupling noise of at least one of said nets is above said noise-failure threshold, selecting a design response to reduce said coupling noise to below said noise-failure threshold; and
   completing detailed routing utilizing said global routing and said design response.

9. The method of claim 8, wherein:
   said determining step includes the step of performing a noise analysis for each of said plurality of interconnects utilizing a combination of models from among said worst-case and said average case models.

10. The method of claim 9, wherein said at least one interconnect parameter is selected from among switching windows, capacitive coupling, and signal transition times.

11. The method of claim 8, wherein said selecting step encodes a routing design rule for routing said interconnect during a detailed routing.

12. The method of manufacture of claim 8, wherein said design response of said selecting step includes:
   identifying an available power supply line crossing a tile of said IC; and
   assigning one of said each net with coupling noise above said noise-failure threshold to a wire adjacent to said power supply line.

13. The method of claim 12, further including the steps of:
   determining if each net with coupling noise above said noise-failure threshold has been assigned; and
   if not, assigning at least one remaining net to a wiring track in said tile with larger spacing.

14. The method of claim 13, further comprising the step of increasing the pitch of said net.

15. The method of claim 13, further comprising the step of, in response to not locating a wiring track with larger spacing on said tile, inserting at least one repeater in said net.

16. A computer program product for coupled noise estimation and avoidance in nets on a circuit, said computer program product comprising:
   a computer readable medium; and
   program instructions on said computer readable medium for:
      designing a global routing of a plurality of nets of an integrated circuit utilizing global paths;
      estimating worst-case and average-case models for said at least one net parameter;
      determining whether coupling noise of any one of said plurality of nets is above a noise-failure threshold; and
      in response to determining that coupling noise of at least one of said nets is above said noise-failure threshold, selecting a design response to reduce said coupling noise to below said noise-failure threshold.

17. The computer program product of claim 16, further comprising program instructions for completing detailed routing utilizing said global routing and said design response to prevent said net from failing due to said coupling noise.

18. The computer program product of claim 16, wherein:
   said determining program instructions includes the instructions for performing a noise analysis for each of said plurality of interconnects utilizing a combination of models from among said worst-case and said average case models.

19. The computer program product of claim 18, wherein said selecting program instructions encodes a routing design rule for routing said interconnect during a detailed routing.

20. The computer program product of claim 18, wherein said program instructions for selecting a design response includes:
   instructions for identifying an available power supply line crossing a tile of said IC; and
   instructions for assigning at least one of said each net with coupling noise above said noise-failure threshold to a wire adjacent to said power supply line.

21. The computer program product of claim 20, further including program instructions for:
   determining if each net with coupling noise above said noise-failure threshold has been assigned; and
   if not, assigning at least one remaining net to a wiring track on said tile with larger spacing.

22. The computer program product of claim 21, further comprising program instructions for increasing the pitch of said net.

23. The computer program product of claim 22, further comprising program instructions for, in response to not locating a wiring track with larger spacing on said tile, inserting at least one repeater in said net.

24. The computer program product of claim 16, wherein said at least one connection parameter is selected from among switching windows, capacitive coupling, and signal transition times.

* * * * *